United States Patent [19]

Goodwin et al.

[11] Patent Number: 4,725,131

[45] Date of Patent: Feb. 16, 1988

[54] LASER COMBINER

[75] Inventors: Frank E. Goodwin, Burke, Va.;
 Bor-Uei Chen, Studio City, Calif.

[73] Assignee: TRW Inc., Redondo Beach, Calif.

[21] Appl. No.: 710,647

[22] Filed: Mar. 11, 1985

[51] Int. Cl.$^4$ .......................... G02B 27/14; H01S 3/19
[52] U.S. Cl. .................................. 350/174; 350/96.16;
 372/50
[58] Field of Search ............... 350/174, 96.16; 372/45,
 372/50, 96, 98; 128/395

[56] References Cited

U.S. PATENT DOCUMENTS 4,578,791   3/1986   Chen .................................... 372/98

Primary Examiner—John K. Corbin
Assistant Examiner—P. Dzierzynski
Attorney, Agent, or Firm—Noel F. Heal; Robert J. Stern

[57] ABSTRACT

A device for combining the outputs of multiple laser sources to produce a single coherent beam with good far-field characteristics. The device includes an optical star coupler having multiple path lengths that are deliberately chosen to be different, by amounts that give rise to an interference pattern that has constructive interference peaks at periodic cycles along a wavelength interval. The optical path-length differences result in the occurrence of at least one wavelength, within the operating range of the lasers, at which all of the lasers will operate. The relationships among the optical path lengths is such that the lasing wavelength is relatively insensitive to phase mismatches along the path lengths.

8 Claims, 11 Drawing Figures

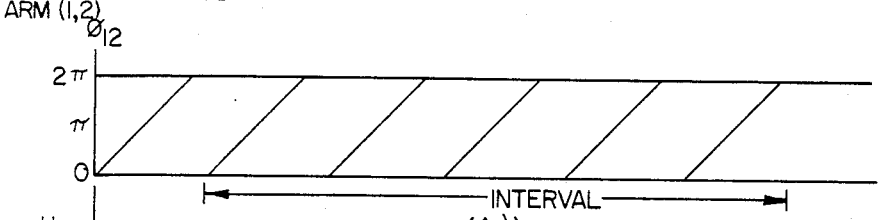
FIG. 3a
FIG. 3b
FIG. 3c
FIG. 3d
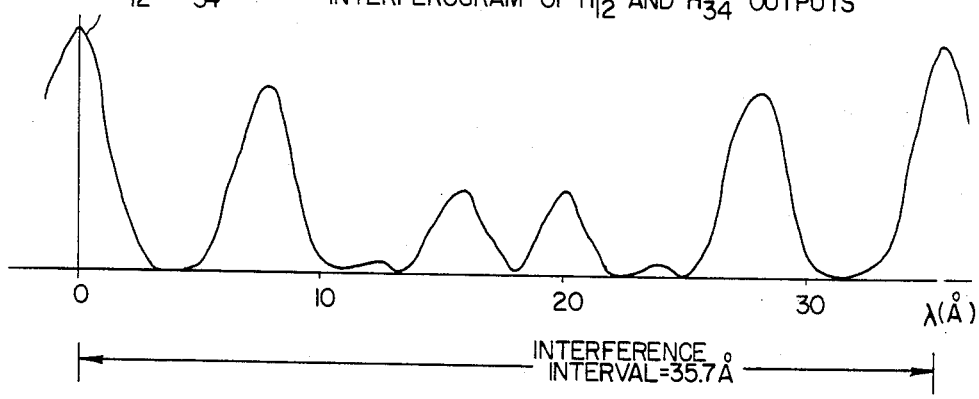
FIG. 4

LASER COMBINER

BACKGROUND OF THE INVENTION

This invention relates generally to devices for combining the outputs of multiple lasers, and more particularly, to laser combiners intended to provide a highly coherent composite laser beam. There is a need in a variety of fiber-optic and communication systems for a high-power pulsed laser, such as a gallium arsenide (GaAs) laser, with a peak power capability of approximately one watt and an average power of 100 mW (milliwatts) or more. Fundamental device limits, such as multimode effects and optical damage at higher power levels, preclude the achievement of these powers from a single laser device.

Various attempts have been made to combine multiple laser outputs into a single source, but with only limited success. One approach has been to place multiple lasers in a linear array, and to rely on coupling between them to achieve some degree of phase locking. Unfortunately, coupling between the adjacent lasers is not sufficient to produce a coherent beam and a desirable far-field pattern of radiation distribution. Moreover, the use of a linear array yields a similarly proportioned linear far-field pattern, which in most cases is less desirable than a more nearly circular pattern.

Use of an optical star coupler has been suggested as a better approach to combining the outputs of multiple lasers, but this has required precise phase alignment of the lasers. Although phase alignment can be achieved with the help of trimming adjustments while the lasers are active, there is no assurance that the alignment will be maintained under conditions of varying temperature and other parameters.

Accordingly, there is still a need for a technique for combining the outputs of multiple lasers in such a manner that a single coherent source is obtained, with a concentrated far-field distribution pattern. The present invention satisfies this need.

SUMMARY OF THE INVENTION

The present invention resides in a laser power combiner that employs an optical star coupler in such a way as to reduce the need for precise phase alignment among the multiple laser sources. Briefly, and in general terms, the laser power combiner of the invention comprises a plurality of laser sources, an optical star coupler having an equal plurality of input ports coupled to a single output port over waveguides having path lengths that differ by preselected amounts, and means for coupling the outputs of the laser sources to the respective input ports of the coupler. A single output mirror at the output port of the optical coupler serves all of the lasers. Over the wavelength range of the laser sources, there is at least one wavelength where perfect phase matching is achieved for all of the sources. Precision in the path lengths is not as critical as when precise phase matching is sought, and the resulting output from the coupler is phase coherent, spanning a very narrow bandwidth in the order of one Angstrom.

More specifically, path lengths for each pair of laser sources are selected to have a path-length difference roughly equivalent to an integral number of wavelengths. Each laser pair produces a different interference periodicity. The periods from several laser pairs overlap and produce a unique output wavelength condition.

It will be appreciated from the foregoing that the present invention represents a significant advance in the field of laser power combiners. In particular, the invention provides a novel technique for combining multiple lasers in such a way as to produce a single phase-locked or coherent beam at practically a single wavelength. Other aspects and advantages of the invention will become apparent from the following more detailed description, taken in conjunction with the accompanying drawings.

BRIEF DESCRIPTION OF THE DRAWINGS

FIGS. 3a–3d are graphs together showing the interference effects in two pairs of waveguides of the combiner;

FIG. 4 is graph plotting the overlap efficiency over a wavelength interval, of two interfering pairs of laser outputs;

DESCRIPTION OF THE PREFERRED EMBODIMENT

Figure 1:
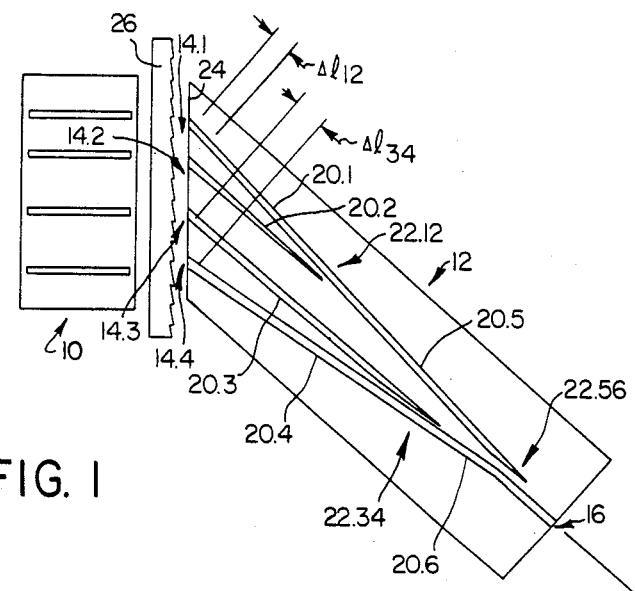
FIG. 1 is diagrammatic plan view of a laser power combiner in accordance with the invention.

As shown in the drawings for purposes of illustration, the present invention is concerned with devices for combining the outputs of multiple lasers into a single composite beam. The principal object of such a combiner is to provide a coherent beam, i.e. one at a single wavelength and with the phases of the multiple laser sources locked together. Ideally, the resulting far-field pattern of the device should be a concentrated and nearly circular one. Prior attempts to combine laser beams in an optical coupler have required the path lengths in the coupler to be as closely matched as possible, so that the phases of the lasers can be precisely matched to achieve the desired goal. This is not only difficult to accomplish, but it is difficult to maintain while temperature and other parameters are varying.

In accordance with the invention, multiple laser sources are coupled to an optical star coupler providing deliberately different path lengths for the lasers. The different path lengths create a dispersive effect. Over the wavelength range in which the lasers have substantial gain, there is at least one wavelength at which perfect phase matching is achieved for all of the lasers. As will be shown in the following discussion, the path lengths can be selected in such a manner that coherent and monochromatic lasing will occur, regardless of phase mismatching between the path lengths.

More specifically, the laser combiner of the invention includes, as shown in FIG. 1, a linear array of lasers, indicated by reference numeral 10, and an optical star coupler 12 having multiple input ports 14 and a single output port 16. The coupler 12 is shown as having four input ports, indicated as 14.1-14.4, and is constructed in such a manner that the path length from input port 14.1 to output port 16 is longer than the next adjacent path length from input port 14.2 to the output port. The path lengths get progressively shorter across the coupler, the one from input port 14.4 to the output port 16 being the shortest. The coupler 12 includes six distinct waveguide sections, indicated at 20.1-20.6 and three hybrid junctures 22.12, 22.34 and 22.56. Waveguide sections 20.1-20.4 extend from the input ports 14.1-14.4, respectively. Waveguides 20.1 and 20.2 merge at the juncture 22.12, and waveguides 20.3 and 20.4 merge at the juncture 22.34. Waveguide sections 20.5 and 20.6 extend from the junctures 22.12 and 22.34 to the third juncture 22.56, which combines the energy from all four inputs and is coupled directly to the output port 16.

The path length differences in the coupler 12 result in a coupler input face 24 that is angularly inclined to the waveguide sections 20 and to the direction of energy propagation through the coupler. This requires that there be some means for launching the laser energy from the lasers 10 in a direction that is within the acceptance angle of the waveguide sections 20.1-20.4, without significant loss and without introducing any phase differences in the respective paths. To achieve this goal, a blazed transmission grating 26 is employed between the laser array 10 and the star coupler 12. The grating 26 has the effect of deflecting the laser beams from the array 10 through a large angle.

Coupling between the lasers 10, the blazed grating 26 and the star coupler 12 is effected by means of anti-reflective coatings at the various interfaces. A single output mirror is provided by means of a reflective coating at the output port 16 of the coupler 12. Thus the lasers each have a cavity length that extends to the output port 16 of the coupler 12.

Figure 2:
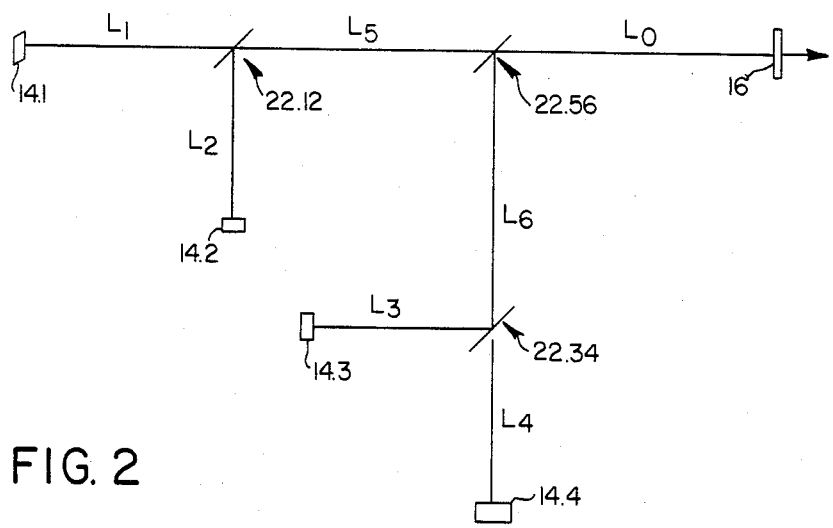
FIG. 2 is a schematic diagram of the laser combiner of the invention, showing the significant optical path lengths in the device.

For purposes of explanation, the diagrammatic view of FIG. 2 serves to indicate the various optical path lengths within the coupler 12. In particular, $L_1$, $L_2$, $L_3$ and $L_4$ are the path lengths from input ports 14.1-14.4, respectively, to the nearest hybrid juncture. The lengths $L_5$ and $L_6$ are the distances from junctures 22.12 and 22.34, respectively, to juncture 22.56. The length from the juncture 22.56 to the output port 16 is designated 10, and is a length in common to all of the lasers. It therefore has no effect on the operation of the device.

Operation of the combiner of the invention can best be understood in terms of pairs of lasers and corresponding optical paths. The path-length difference for waveguides 20.1 and 20.2 is $\Delta_{12}$, and for the other pair of waveguides 20.3 and 20.4 is $\Delta_{34}$. Consider the first pair of lasers alone. The phase difference for the first two path lengths is $d\phi_{12}$. When this phase difference is 0, $2\pi$, or a multiple of $2\pi$, the energy from the two paths is in phase at hybrid juncture 22.12. If the phase difference is $\pi$ or a multiple of $\pi$, there is cancellation of the hybrid juncture.

FIGS. 3a and 3b show the phase difference $d\phi_{12}$ and the combined signal at juncture 22.12, respectively, as the wavelength $\lambda$ is varied over a relatively narrow range. The phase difference $d\phi_{12}$ varies linearly from 0 to $2\pi$ periodically. At the same time, the combined energy at the juncture 22.12 varies cyclicly, with maxima occurring at $2\pi$ values of phase difference and minima occurring at $\pi$ values of phase difference. The periodicity $d\lambda 12$ is defined as the wavelength change over which the phase difference changes by $2\pi$.

For a small change in wavelength $d\lambda$, the change in phase over length $L_1$ may be computed as follows. First assume that there is a phase delay of zero at wavelength $\lambda$, i.e. that $L_1$ is an integral number of wavelengths long. If this integral number is $\beta$, then the phase delay resulting from a change of wavelength $d\lambda$ is given by:

$$d\phi_1 = 2\pi \cdot \beta \cdot d\lambda/\lambda \quad (1)$$

But since $\beta = L_1/\lambda$, this may be expressed as:

$$d\phi_1 = 2\pi \cdot L_1 \cdot d\lambda/\lambda^2 \quad (2)$$

The change in phase difference between the $L_1$ and $L_2$ path lengths is therefore given by:

$$d\phi_{12} = 2\pi \cdot \Delta L_{12} \cdot d\lambda/\lambda^2 \quad (3)$$

The change in wavelength $d\lambda_{12}$ necessary to achieve a phase difference change of $2\pi$ is given from equation (3) as:

$$d\lambda_{12} = \lambda^2/\Delta L_{12} \quad (4)$$

Similarly, the wavelength change $d\lambda_{34}$ resulting in a $2\pi$ phase difference change for lengths $L_3$ and $L_4$ is given by:

$$d\lambda_{34} = \lambda^2/\Delta L_{34} \quad (5)$$

If $L_1$-$L_4$ are chosen to make $\Delta L_{12}$ different from $\Delta L_{34}$, the result is shown graphically in FIGS. 3a-3d. An interference pattern will be set up in which there is a wavelength interval $\Delta\lambda$ between points of phase coincidence of the output signal from the hybrid junctures 22.12 and 22.34. For the interference interval $\Delta\lambda$, $$d\phi_{12} - d\phi_{34} = 2\pi.$$

From equation (3) and a similar equation for the hybrid juncture 22.34, this may be rewritten as:

$$2\pi \cdot \Delta L_{12} \cdot \lambda/\lambda^2 - 2\pi \cdot \Delta L_{34} \cdot \Delta\lambda/\lambda^2 = 2\pi,$$

from which:

$$\Delta\lambda = \lambda^2/(\Delta L_{12} - \Delta L_{34}). \quad (6)$$

It will be noted that FIGS. 3b and 3d show that there are five periods per interference interval for one pair of the optical paths, while there are only four periods for the other pair of optical paths. These numbers of periods are defined as the degeneracy of each pair of arms. More generally, the degeneracy is defined as:

$$n_{12} = \Delta\lambda/d\lambda_{12} \text{ and } n_{34} = \Delta\lambda/d\lambda_{34} \quad (7)$$

Another term of significance is the overlap efficiency of the two interfering output pairs. At wavelengths where the phase difference $d\phi_{12} - d\phi_{34}$ is zero or a multiple of $2\pi$, the overlap efficiency is unity. This occurs at the wavelength intervals $\Delta\lambda$. The entire interference function is given by the expression:

$$T = \frac{1}{2}(1 + \cos d\phi_{12}) \cdot \frac{1}{2}(1 + \cos d\phi_{34}) \quad (8)$$

This function is plotted in FIG. 4 for the case in which $\Delta L_{12}$ is 1 mm and $\Delta L_{34}$ is 0.8 mm, and where the phase difference is zero at the maxima of the function. The interval over which the function in FIG. 4 is plotted is 35.7 Angstroms, which corresponds to Δλ.

Although the interference pattern defined by FIG. 4 provides a basis for phase locking multiple laser sources, a more important aspect of the invention is the degree to which it is insensitive to arbitrary phase delays inserted in the arm of the optical coupler 12. The effect on the interference function of a phase delay $\Gamma_o$ in one of the lengths $L_1$, $L_2$, is given by:

$$T = \tfrac{1}{2}(1 + \cos(d\phi_{12} + \Gamma_o)) \cdot \tfrac{1}{2}(1 + \cos d\phi_{34}) \quad (9)$$

Figure 5:
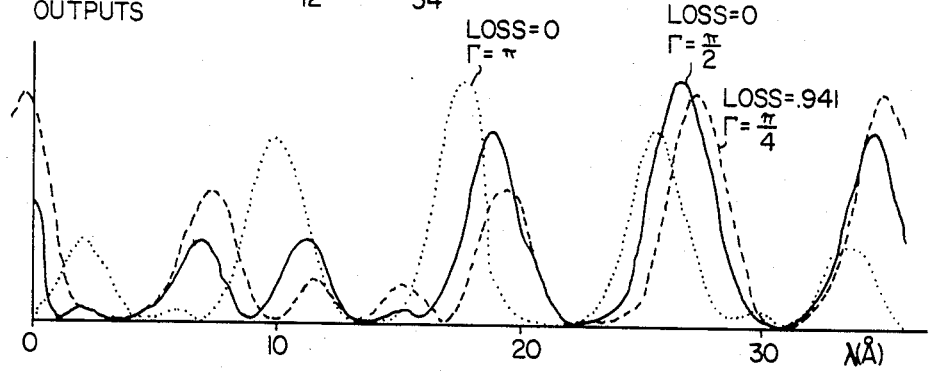
FIG. 5 is a graph similar to FIG. 4, but showing the effect of an arbitrary fixed phase difference in one of the laser paths.

This function is plotted in FIG. 5 for three values of $\Gamma_o$, namely $\pi/4$, $\pi/2$, and $\pi$. It will be noted from these curves that, for the values $\pi/2$ and $\pi$, no loss occurs, since the phase functions $d\phi_{12}$ and $d\phi_{34}$ coincide at different values of wavelength. However, for a value of $\Gamma_o = \pi/4$, the phase functions do not coincide over the interference interval and a net loss occurs, meaning an overlap efficiency of less than unity. The maximum overlap efficiency as a function of $\Gamma_o$ is given by:

$$T_{MAX} = \left[\tfrac{1}{2}\left(1 + \cos\frac{2\Gamma_o}{n_{12} + n_{34}}\right)\right]^2 \quad (10)$$

Figure 6:
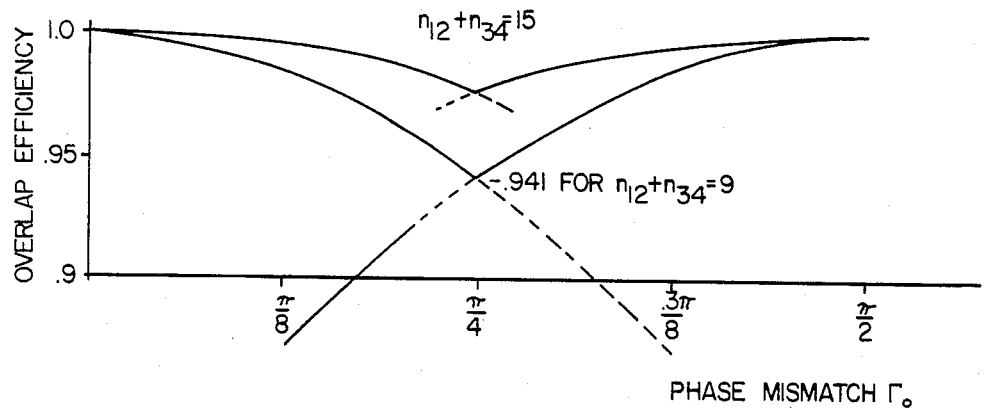
FIG. 6 is a graph showing the effect of phase mismatch on the maximum overlap efficiency of two pairs of lasers.
Figure 7:
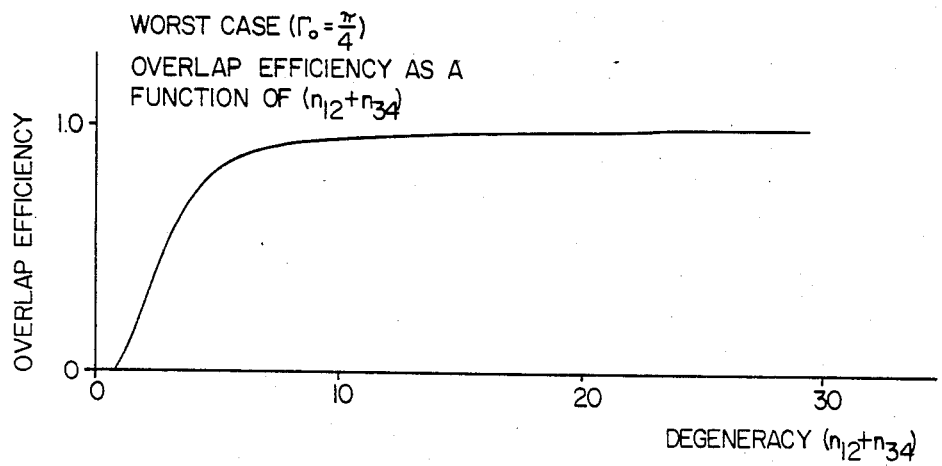
FIG. 7 is a graph showing the effect of total degeneracy on the worst-case overlap efficiency of two pairs of lasers.

This expression for the maximum overlap efficiency is important in that it shows how the efficiency can be increased by increasing the total degeneracy of the pairs of outputs being combined. This effect is shown graphically in FIGS. 6 and 7. In FIG. 6 the overlap efficiency is plotted against phase mismatch angle $\Gamma_o$, for total degeneracy values of 9 and 15, respectively. It will be noted that, even in the worst-case condition of a phase mismatch of $\pi/4$, the overlap efficiency is about 0.95 for degeneracy values above 9. FIG. 7 plots the overlap efficiency as a function of total degeneracy, for the worst-case phase mismatch ($\pi/4$). This also shows graphically that the overlap efficiency can be maintained above 0.95 so long as a total degeneracy of ten or more is selected. These degeneracy values are, of course, easily achieved by appropriate selection of the lengths $L_1$-$L_4$.

The outputs from the hybrid junctures 22.12 and 22.34 are combined in the third juncture 22.56. If the lengths $L_5$ and $L_6$ are selected to be different from each other, a third interference function is defined and may be expressed as:

$$T = \tfrac{1}{2}(1 + \cos d\phi_{56}), \quad (11)$$

where, $$d\phi_{56} = 2\pi \cdot \Delta L_{56} \cdot d\lambda_{56}/\lambda \quad (12)$$

Figure 8:
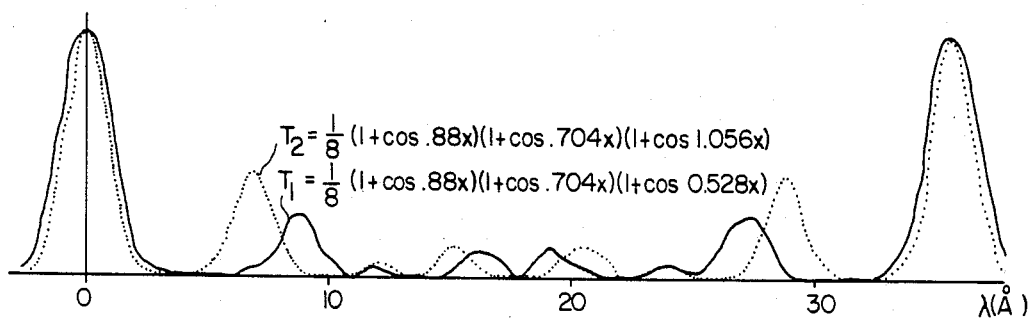
FIG. 8 is a graph similar to FIG. 4, showing the overlap efficiency of two pairs of lasers after combining into a single output beam.

The function defined in equation (11) effectively multiplies the overlap efficiency function defined by equations (8) and (9), and further improves the coupler's performance as an interference filter. FIG. 8 plots the total efficiency of the device for values of $\Delta L_{56}$ of 1.2 mm and 0.6 mm. The effect of adding the third interference condition is to sharpen the response passband of the combiner. The unity efficiency values are maintained at the interference intervals, but the intermediate peaks of efficiency are much reduced in magnitude. For the conditions given in this example, the filter passband (defined as 90% of the energy) is approximately one Angstrom wide. This narrow passband assures that the laser combiner will permit laser oscillation to occur only within the wavelength regions defined by the filter passband. Typically, the laser gain linewidth, which is a measure of the spectral purity of the laser, is about 60 Angstroms. The filter interference interval is 35.7 Angstroms. For these conditions, the filter of the invention will provide a minimum of one order of oscillation, and a maximum of two orders, lying within the laser gain linewidth. This condition assures a single laser oscillating frequency.

When the combiner is operating at a single wavelength and producing a single coherent output, there are two sets of conditions that will be in effect. First, the length of each laser cavity, from the common output mirror to the reflector within the laser, must be an integral multiple of half wavelengths. The second condition relates to the effective operation of the hybrid junctures. In order for two single-mode light beams to be combined at a hybrid juncture, the phases of the beams must differ by a fixed and known value. Otherwise a small amount of laser energy will be lost to substrate material underlying the juncture. If this loss is great enough, the lasing action will cease. To meet this condition requires the provision of a trimming adjustment for each of the junctures. The power output can be monitored while the adjustments are made, under active operating conditions. This hybrid juncture condition is not inconsistent with the basic principle of the invention, which is to provide a lser power combiner in the form of a star coupler that is highly tolerant to phase mismatch among the various arms of the coupler.

It will be appreciated that the earlier discussion of the effect of phase mismatch on overlap efficiency applies also to the composite interference characteristic of FIG. 8. Since the performance of the device, as measured by maximum overlap efficiency, is practically insensitive to phase mismatch if the degeneracy values are high enough, the invention provides an extremely useful technique for combining multiple lasers into a single high-power beam that is highly coherent and has good far-field properties.

It will also be appreciated from the foregoing that, although a specific embodiment of the invention has been described in detail for purposes of illustration, various modifications may be made without departing from the spirit and scope of the invention. Accordingly, the invention is not to be limited except as by the appended claims.

We claim:

1. A laser power combiner, comprising:
 a plurality of laser sources;
 an optical star coupler having an equal plurality of input ports, a single output port, and a plurality of optical paths between the input ports and the output port, the optical paths having path lengths that differ by preselected amounts, to provide for constructive interference of energy from the laser sources, at periodically spaced wavelengths; and
 means for coupling the outputs of the laser sources to respective input ports;
 wherein a single output mirror at the output port of the optical coupler serves as an output mirror for all of the laser sources, and whereby, over the wavelength range of the laser sources, there is at least one of the periodically spaced wavelengths at which perfect phase matching is achieved for all of the sources.

2. A laser power combiner as set forth in claim 1, wherein:

the input ports are arranged in pairs;

each pair of input ports has associated with it a path-length difference that provides a phase difference at a point in the coupler where the energy entering the pair of ports is combined; and different pairs of input ports have different phase differences associated with them, such that the combination of energy from two different pairs of input ports will produce an interference pattern with constructive interference at periodic intervals over a range of wavelengths;

whereby at least one wavelength at which constructive interference occurs falls within the range of operation of the laser sources, and coherent lasing takes place at that wavelength.

3. A laser power combiner as set forth in claim 2, wherein:

there are four laser sources and four input ports;

the optical coupler includes first and second hybrid junctures to combine the inputs from first and second pairs of input ports, and a third hybrid juncture to combine the outputs of the first and second hybrid junctures;

and wherein the optical path lengths are selected to provide different phase differences at the inputs of the first and second junctures, to yield an interference function with at least one point of constructive interference between the outputs of the first and second junctures, over a wavelength interval.

4. A laser power combiner, comprising:

a plurality N of laser sources;

an optical star coupler having N input ports, a single output port with an output mirror, a plurality of waveguides and a plurality of energy combining means; and means for launching energy from the laser sources into the respective input ports without substantial loss or non-uniform phase change;

wherein the waveguides and energy combining means provide N partly overlapping optical paths between the input ports and the output port, the path lengths being selected to provide a phase difference between inputs to each energy combining means, each such phase difference varying periodically over a range of wavelengths, such that the further combination of outputs of the energy combining means produces an interference function with narrow peaks of low loss recurring periodically over a wavelength interval.

5. A laser power combiner, comprising:

four laser sources;

an optical star coupler having four input ports, one output port, first, second and third hybrid junctures, four input waveguides connecting the input ports in pairs to the first and second junctures, two intermediate waveguides connecting the outputs of the first and second junctures to the third juncture, and an output waveguide connecting the output of the third juncture to the output port;

means for coupling the laser sources to the respective input ports without substantial loss of energy and without any differential phase shift;

and wherein the path lengths of the input waveguides are $L_1$, $L_2$, $L_3$ and $L_4$, and the path lengths of the intermediate waveguides are $L_5$ and $L_6$, the path length difference $L_1-L_2$ is selected to provide an output from the first juncture that varies periodically as the wavelength is uniformly changed, such that there are $n_{12}$ cycles of output variation over a wavelength interval $\Delta\lambda$, the path length difference $L_3-L_4$ is selected to provide an output from the second juncture that varies periodically as the wavelength is uniformly changed, such that there are $n_{34}$ cycles of output variation over the same wavelength interval, which interval is the shortest one spanning points of constructive interference between the outputs of the first and second junctures, and the interference between the two outputs is relatively insensitive to phase mismatch between the pairs of inputs to the junctures.

6. A laser power combiner as set forth in claim 5, wherein:

the values of $n_{12}$ and $n_{34}$ are high enough to result in high overlap efficiency between the two outputs from the first and second, even with arbitrary phase mismatch between the pairs of path lengths.

7. A laser power combiner as set forth in claim 6, wherein:

the path length difference $L_5-L_6$ is selected to provide an additional filtering action on the combined interference function resulting from the outputs from the first and second junctures.

8. A laser power combiner, comprising:

a plurality of laser sources;

an optical star coupler having an equal plurality of input ports, a single output port, and a plurality of optical paths between the input ports and the output port, the optical paths having path lengths that differ by preselected amounts, to provide for constructive interference of energy from the laser sources, at periodically spaced wavelengths; and means for coupling the outputs of the laser sources to respective input ports;

wherein a single output mirror at the output port of the optical coupler serves as an output mirror for all of the laser sources, and whereby, over the wavelength range of the laser sources, there is at least one of the periodically spaced wavelengths at which perfect phase matching is achieved for all of the sources;

and wherein the input ports are arranged in pairs, each pair of input ports has associated with it a path-length difference that provides a phase difference at a point in the coupler where the energy entering the pair of ports is combined, different pairs of input ports have different phase differences associated with them, such that the combination of energy from two different pairs of input ports will produce an interference pattern with constructive interference at periodic intervals over a range of wavelengths, whereby at least one wavelength at which constructive interference occurs falls within the range of operation of the laser sources, and coherent lasing takes place at that wavelength, there are four laser sources and four input ports, the optical coupler includes first and second hybrid junctures to combine the inputs from first and second pairs of input ports, and a third hybrid juncture to combine the outputs of the first and second hybrid junctures, the optical path lengths are selected to provide different phase differences at the inputs of the first and second junctures, to yield an interference function with at least one point of constructive interference between outputs of the first and second junctures, over a wavelength interval, and the means for coupling the laser sources to the optical coupler include a blazed transmission grating.

* * * * *